US009946967B2

(12) United States Patent
Florek et al.

(10) Patent No.: US 9,946,967 B2
(45) Date of Patent: Apr. 17, 2018

(54) TEMPORARY CARRIER OF A REMOVABLE MEMORY CARD

(71) Applicant: LOGOMOTION, S.R.O., Piest'any (SK)

(72) Inventors: Miroslav Florek, Bratislava (SK); Michal Masaryk, Bratislava (SK); Pavel Travnicek, Belkovice-Last'any (CZ)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 14/386,977

(22) PCT Filed: Mar. 22, 2013

(86) PCT No.: PCT/IB2013/052286
§ 371 (c)(1),
(2) Date: Sep. 22, 2014

(87) PCT Pub. No.: WO2013/140376
PCT Pub. Date: Sep. 26, 2013

(65) Prior Publication Data
US 2015/0076237 A1    Mar. 19, 2015

(30) Foreign Application Priority Data

Mar. 22, 2012  (SK) .................................. 50010-2012
May 18, 2012   (SK) .................................. 50018-2012

(51) Int. Cl.
*G06K 19/06*     (2006.01)
*G06K 19/077*    (2006.01)
*G06K 19/073*    (2006.01)

(52) U.S. Cl.
CPC . *G06K 19/07739* (2013.01); *G06K 19/07345* (2013.01); *G06K 19/07716* (2013.01);
(Continued)

(58) Field of Classification Search
CPC ....... G06K 19/07716; G06K 19/07743; G06K 7/0008; G06K 19/077; G06K 19/00;
(Continued)

(56) References Cited

U.S. PATENT DOCUMENTS 7,559,469 B2 *  7/2009  Noda ................... G06K 7/0021
                                               235/441
8,446,728 B1 *  5/2013  McDonald ....... G06K 19/07739
                                               361/737

(Continued)

FOREIGN PATENT DOCUMENTS

DE    29819389 U1      1/1999
WO    WO 2011/141864 A1   11/2011

OTHER PUBLICATIONS

International Patent Application No. PCT/IB2013/052286: International Search Report dated Mar. 22, 2013, 3 pages.

*Primary Examiner* — Thien T Mai
(74) *Attorney, Agent, or Firm* — Baker & Hostetler, LLP

(57) ABSTRACT

A temporary carrier of a removable memory card (2) is in the shape of a flat card (1), where the removable memory card (2) forms an element to be released from the flat card body (1). The removable memory card (2) has at least five additional contacts (4) for temporary usage before the removable memory card is removed from the flat card (1) body. The additional contacts (4) take up a smaller surface as a contact field (5) of a standardized flat card (1). The removable memory card (2) is located within the flat card (1) in such a way that the position of additional contacts (4) corresponds to the position of a standardized flat card (1) contact field (5). The suitable sixth additional switch contact (8) can be used to switch secure elements. The temporary carrier is inserted into a standard burning device, which operates with it in the same way as it would with a common card with a contact field (5).

9 Claims, 6 Drawing Sheets

Figure 1:
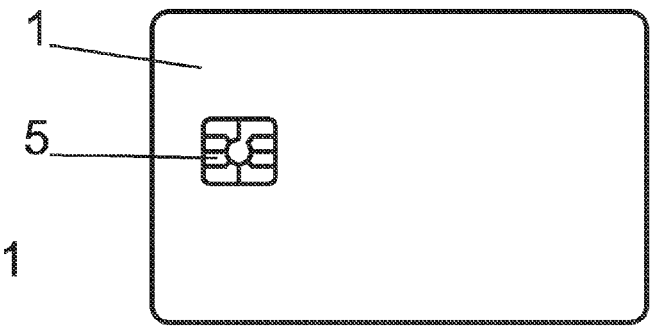

(52) U.S. Cl.
CPC . *G06K 19/07741* (2013.01); *G06K 19/07745* (2013.01); *H01L 2924/0002* (2013.01); *Y10T 29/49155* (2015.01)

(58) Field of Classification Search
CPC ....... G06K 19/07741; G06K 19/07732; G06K 19/0721; G06K 7/0021; G06K 19/07739; G06K 19/07345; G06K 19/0772; G06K 19/07745; G06F 12/00
USPC .......................................... 235/441, 380, 492
See application file for complete search history.

(56) References Cited

U.S. PATENT DOCUMENTS

| | | | |
|---|---|---|---|
| 2003/0213849 A1* | 11/2003 | Luu | G06K 19/072 235/492 |
| 2005/0212690 A1* | 9/2005 | Nishikawa | G06K 7/006 340/932.2 |
| 2009/0065587 A1* | 3/2009 | Phillips | G06K 19/07739 235/492 |
| 2009/0108060 A1* | 4/2009 | Phillips | G06K 19/07716 235/492 |
| 2010/0243734 A1* | 9/2010 | Cho | G06K 19/07 235/492 |
| 2011/0163168 A1* | 7/2011 | Gallo | G06K 7/0008 235/492 |
| 2012/0048948 A1* | 3/2012 | Bertin | G06K 19/07716 235/492 |
| 2013/0080702 A1* | 3/2013 | Cho | G06F 12/00 711/115 |

* cited by examiner

Fig. 23　　　　　　　　　　Fig. 24

TEMPORARY CARRIER OF A REMOVABLE MEMORY CARD

CROSS-REFERENCE TO RELATED APPLICATIONS

This application is the National Stage of International Application No. PCT/IB2013/052286 filed Mar. 22, 2013, which claims the benefit of Slovakia Patent Application No. PP 50010-2012 filed Mar. 22, 2012 and Slovakia Patent Application No. PP 50018-2012 filed May 18, 2012, the disclosures of which are incorporated herein by reference in their entireties.

FIELD OF INVENTION

The solution refers to a temporary carrier of removable memory cards, mostly small memory cards such as a microSD. The temporary carrier assures unification of a contact field that is used during first upload of software and data into the removable memory card. This card will be used as an electronic payment device. The invention also describes a new method of how the removable memory card is processed and personalized.

PRESENT TECHNOLOGY

Payment cards with a chip usually are of the credit card size in accordance with the ISO/IEC 7810 standard—85.60 mm×53.98 mm×0.76 mm. This size became a standard used even in case of other types of plastic cards. Devices and one-purpose devices for the processing, upload and personalization of flat cards are being developed and produced exactly for plastic cards of the mentioned parameters. In the initial phase of payment cards personalization, one-purpose machine devices are used; these manage automatic manipulation with empty payment cards (without any uploaded data and/or software) and they comply with strict security criterions so that banks and card users could use the services of these highly productive devices.

According to other solutions and inventions of the Logomotion s.r.o. applicant, new payment devices in the form of removable memory cards will be introduced; these will be inserted into the slot for extending accessories of a mobile phone and then provide to users new and comfortable possibilities of secure payment. Similarly to older patent applications, first it will be necessary to upload more data and applications to the removable memory card as e.g. configuration data, indifferent payment-terminal application, EMV (EuroPay MasterCard Visa) application, encryption keys and also the personal data of the payment device user. This upload of data step can be done outside the production processes of the hardware itself since the payment card issuer wants to have this step under his own secure control and in the same time he needs to react flexibly to the requirements of new users.

Besides other parts, the new payment devices in the form of the above mentioned removable memory cards will have even a common contact interface e.g. the one according to the SD Card Association standards with eight contacts. This contact interface will be used for data transmission and power supply after the removable memory card is inserted into the mobile phone slot.

The data transmission, during memory card personalization to a payment device, can be assured through the mentioned contacts of the contact interface; nevertheless, due to the requirement for high-productive upload and processing, new one-purpose devices that could work with this small card format would have to be developed and produced. In case of a microSD card, the parameters are 15 mm×11 mm×1 mm. The development, introduction and certification of new devices takes a long time and their usage would not be universal in comparison to the existing payment cards.

It is also possible to transfer data and software into the removable memory card through a contactless communication interface in case the removable memory card has it, however, this kind of solution is slow, not very stable and complicated.

The small parameters of the microSD also have a disadvantage that in case of its distribution and manipulation on the side of the user, the card can get lost, fall out without the user noticing it since it is difficult to operate with a small card. Until now there was no technical requirement for the improvement of manipulation features since the effort to miniaturize memory cards is a priority, a feature that is related to the miniaturization of slots of cooperating devices. However, in our case it can be assumed that after the removable memory card is delivered to the corresponding user, he will insert it into the corresponding slot in the mobile phone and there will be no need to remove it, transfer it or manipulate with it in any way since this memory card will fulfill mainly the role of the payment device connected to the mobile phone.

It is also necessary to design a procedure that will be used for safe loading of data and software with structured and hierarchical access rights of individual participants within the production and personalization process, to a removable memory card.

Solutions, which insert a small card to the surface of a bigger card as in e.g. DE 29819389 U1 are known, however these kinds of solution cannot solve the problem in case the whole small card is smaller than the size of the whole contact field according to the corresponding standard. There is also a solution of the same applicant Logomotion s.r.o. that was published as WO 2011/141864 A1 that uses the whole contact field, which is interconnected with the small card placed next to it through a conductive path. However, a solution that will have even more simple and cheaper production of the flat card without conductive connective parts is required.

The Subject Matter of the Application

The mentioned deficiencies are to a great extent eliminated by a temporary carrier with a removable memory card, the inner circuits of which contain at least one secure element; the removable memory card has a contact interface with a contact arrangement different to the standardized contact field of the flat payment card; the subject matter of the temporary carrier is based in the fact that it is in the shape, width and length of a standardized plastic flat card and that the removable memory card forms an element within the flat card—an element that is intended for removal. This removal can be done by breaking the card out of the flat card body; the removal line is limited by the outer shape of the removable memory card. The important feature is that the removable card contains at least five additional contacts for temporary usage (before the removable memory card is taken out of the flat card body) on its surface away from contact interface. The additional contacts together take up smaller surface area than the contact field of the standardized flat card and, also, even every individual additional contact takes up a smaller surface than the corresponding contact in the standardized contact field. The sum of surfaces of additional contacts on the removable memory card is smaller than the standardized surface of flat plastic card contact field; usually, it is smaller than a half or a third of the standardized big contact surface. The sum of additional contact surface on the removable memory card is also smaller than the surface of the corresponding number of contacts standardized for the contact field of the plastic flat card.

In general, the five additional contacts can be in various positions with respect to each other, however, they always must correspond to some of the contacts of the standardized contact field. The additional contacts can be placed in one row (4+1) or two rows (3+2), they can be placed in one axis or they can be placed even in a suitable mutual position that corresponds to the functions of individual contacts according to the standardized contact field.

The gaps between the additional contacts basically correspond to the gaps between contacts on a standardized flat card—but within the flat card, the removable memory card is oriented and located in such a way so that its position and distance of additional contacts from the edges of the temporary carrier correspond to the position of the standard flat card standardized contact field. The gaps of additional contacts can differ from the gaps in a standardized contact field in the range that will continue having the same projections of additional contacts within the corresponding contact surface. So, the additional contact cannot be placed nearer to the neighboring additional contact in such a way that would shift this additional contact over the edge of the big standardized contact in case of the projection of this additional contact to the standardized big contact field. The gaps between two middle additional contacts can be the same as the gap between the corresponding standardized contact field contacts; the two edge contacts can be shifted closer to the middle two additional contacts, however, this only if they do not go over the contact edge of the standardized contact field. The exact tolerances of gaps in relation to the size of additional contacts are limited by touch needles and by the burning device mechanism.

The additional contacts are interconnected with the inner circuits of the removable memory card—independently from the contact interface, which later, after the removable memory card is released from the temporary carrier, is the only functional contact interface of the removable memory card. It deals mostly with removable memory cards, to which data and/or payment application software should be loaded in a contact way mainly using a device used for personalization of chip payment cards.

Basically, the removable memory card has a contact interface intended for the interconnection in the mobile communication device slot—mainly this means in the slot of a mobile phone. This interface will be configured e.g. according to the SD Card Association specification for the parameters of the microSD. The important element of the temporary carrier, according to this invention, is that additional, only temporarily usable contacts are created on the removable memory card. These contacts will be smaller than the contacts in the contact field of the common, standardized flat card, however, the gaps between them will correspond to the gaps between contacts on the standardized flat card. The number of additional contacts will always be smaller than the number of contacts the flat card standardized contact field. There will always be at least five contacts, e.g. C1, C2, C3, C5, C7 according to ISO 7816. The smallest number of the additional contacts can be limited by the size of the contact needle in the device for data processing, personalization of the standardized payment cards.

Some new personalization devices have the ability to set functions and tasks of individual contact needles that are completely independent from the original function distribution and their tasks set according to the standard. When using this kind of device we can place the additional contacts arbitrarily according to any group of contacts of the standardized field. However, it will be more suitable to use five additional contacts in the positions C1, C2, C3, C5 and C7. The advantage of this will be above all in the fact that in the personalization phase as such it would be possible to use current device without any changes. In case the pre-personalization and personalization phases were divided logistically, only a small number of software adjusted devices, in which removable memory cards would be set for the final personalization, would be sufficient. The personalization could then run on a huge number of unadjusted devices that simultaneously can process even common payment cards.

The additional contacts corresponding to standardized C1 and C5 are interconnected with inner circuits of a removable memory card; they are intended for the powering and/or data transmission to inner circuits. C1 represents the powering, C5 the grounding, ground. The additional contact corresponding to the standardized C2 contact is interconnected with the inner circuit and it is intended for reset of processes in inner circuit and for reset of processes that run during communication between a burning device and a removable contact card. The additional contact corresponding to a standardized C3 contact is interconnected with an inner circuit and is intended for clocking (clock-rate) of communication that runs over the additional contacts. The additional contact corresponding to the standardized C7 contact is interconnected with the inner circuit and it is intended for the serial input output I/O (half-duplex). These additional five contacts create a communication path that is accessible during processing in common devices for loading of data and personalization of payment card chips. So, it will not be necessary to adjust this device from the hardware point of view in order to burn small removable memory cards, mostly of the microSD format. This device will be equipped with new and/or adjusted software thanks to which it will communicate with a removable memory card over five or possibly over six additional contacts, which to contact needles, however, will appear as common contacts of a standardized flat chip card contact field.

The advantageous sixth additional contact will be used above all in the case the removable memory card has several secure elements, mainly two secure elements in the form of two hardware independent chips ICC1 and ICC2. The sixth additional contact is interconnected with the inner circuits for the exclusive switch of one secure element into an active mode; then the secure elements can be attended independently, in burning phases, in which the removable memory card appears to have only one secure element, the one that is switched into an active mode. It will also be suitable if the control over the sixth additional contact is set in such a way that in case the sixth additional contact is not used in the device, it will represent access to the secure element in the personalization phase, so the access by the issuer of the payment card included in the removable memory card. In principle, the issuer does not need to have access to the second secure element.

By its position, in the suitable configuration, the sixth additional contact will correspond to the C4 contact according to ISO 7816; it will be placed in the axis of three additional contacts C1 to C3.

After the final personalization phase, the temporary carrier can fulfill the function of a mechanical carrier, mechanical sleeve, in which the user will receive the removable memory card. However the additional contacts will always be intended only for the usage in the burning device.

Since the removable memory card, the temporary carrier of which is described here, will (in suitable configuration) include even the NFC communication element with an antenna directly in the removable memory card body, it will be suitable if at least some parts of the five additional contacts, possibly even the sixth additional contacts is placed outside the antenna's projection to the outer surface of the removable memory card. The orientation of the removable memory card on the temporary carrier and the corresponding mutual placement of additional contacts with respect to the antenna should be designed in such a way so the metal surface of additional contact shield the antenna as little as possible.

The removable memory card can have a disconnector placed between additional contacts and inner circuits of the removable memory card. The disconnector is used to disconnect additional contacts from inner circuits before the removable memory card is removed from the flat card. Disconnection of additional contacts can take place only after the last personalization task in the burning device; the command for the disconnector to disconnect the contacts e.g. in the form of a programmable gate array can come from the burning device, which will have this command within its software.

The disconnector can be even set in such a way that the conductive connection is interrupted after the removable memory card is inserted into the mobile communication device for the first time, since at this moment the removable memory card is definitely removed from the temporary carrier body.

In principle, the disconnector can be even in a mechanical form, e.g. by having conductors that go from the removable memory card board to other flat card body and return back to the removable memory card body through the brake out line. In case the removable memory card is part of the temporary carrier, the conductors are fully functional, however when the removable memory card is broken out of the temporary carrier body, the conductors are interrupted and in this way the conductive path is mechanically disconnected from the additional contacts leading to the inner circuit. In order for the stubs, remnants of the conductors, not to protrude from the edges of the removable memory card, the carriers can have notches, be weakened or similarly attended to on the edge level of the removable memory card, which will assure that the conductors are interrupted right next to the edge of the removable memory card. The disonnector conductors can even go over the brake-out line path connecting the temporary carrier with the removable memory card body—then the conductor disconnection line is defined by shape and by weakened brake-off line.

The connection of the temporary carrier with the removable memory card can be assured even using a foil that holds the removable memory card in the opening of the flat card body.

In order to increase data and software security on the road between personalization in the burning device and the user of the removable memory card, the customer, the flat card can be equipped with a security foil with protective elements—where the secure foil covers at least partially the removable memory card and preferably it covers even the contact interface and additional contacts. The security foil contains protective elements that signal its removal from the carrier so it would not be possible to remove it and place it to the temporary carrier repeatedly. The security foil will be placed to the carrier surface only after the personalization. This foil will enable the user to check that the memory card contact field was not physically accessible until it was delivered to him. After the foil is removed, even the removable memory card can be removed from the temporary carrier by applying only a slight force and this act will also make the contact interface of the memory card accessible. The foil can have perforations so that it would not be possible to stick it back. By this way the protection against unwanted upload of dangerous programs into the memory card, on the road to the user, will be increased.

The temporary carrier of the removable memory card enables to work with the memory card as if this one had the size and features of the standard, full-format ICC card with a contact field that corresponds to the current standards. Due to this, memory cards will be personalized and processed on the same machines as current payment ICC cards.

The flat body of the memory card carrier can be produced in the same step as the production of the memory card plastic body; the brake-out lines will be created, e.g. in the form of a groove that copies the outer shape of the memory card. The groove can be interrupted by connection links.

In case the burning device uses contact needles that are so big that the creation of the contact with small additional contacts according to the description mentioned above is unstable or problematic, a temporary enlargement of the contact surface using a foil with at least five contacts on the outer side of the foil can be formed. The contacts correspond by its placement and shape to corresponding contacts of the normalized flat payment card contact field. They can be of full size as the corresponding five or six contacts of the normalized field. The foil overlaps the brake-out line and the contacts on the foil are interconnected (from the inside) to the additional contacts on the removable memory card. The foil can be removed from the removable memory card body. The conductive path from the outer side of the foil to its inner sided to the additional contacts can be assured in various technical forms, e.g. the full contacts on the outer side of the foil are layered or connected over a conductor to the touch surfaces on the inner side of the foil. The touch pads do not have to be interconnected with the additional contact permanently—rather, it is sufficient if they are pressed against the additional contacts on the removable memory card. Then it is suitable, if the touch pads overreach the inner side of the foil; their protrusion from the surface will cause the touch pads to be pressed to the additional contacts after the foil is applied. In principle, the foil with contacts can be used even repeatedly.

During manipulation in ICC payment card personalization devices, inner circuits within the removable memory card appear from the outside as if they were ICC card chips. The creation of conductive connection between the inner circuits and additional contacts is basically only a one-purpose one and temporary since the user does not need it for the payment device functionality on the removable memory card that is already taken out of the temporary carrier.

Since the standard thickness of the microSD card is 1 mm, which is approximately 0.24 mm more than the thickness of the standard plastic card, then during manipulation in the payment card personalization device there could come to a contact between the feeders and the memory card contact interface. In order to prevent their damage, the memory card carrier can be equipped with a foil that covers at least the memory card contact interface zone or it even covers the entire surface of the flat card with exception of additional contacts.

The removable memory card production and processing method is also new—the processing is based on data and/or software storage using a device that cooperates with the contact field that is different from the contact interface of the removable memory card according to this invention, the subject matter of which is based on the fact that the removable memory card is created as a part of a temporary carrier in the form of a bigger, standardized plastic flat card and on the fact that additional contacts are created on the surface of the removable memory card. The position of these contacts within the temporary carrier corresponds to the placement of contacts on the standardized flat card; the additional contacts are interconnected with inner circuits of the removable memory card. Subsequently, the temporary carrier created in this way is inserted into the device for data and/or software storage, while the device works with the temporary carrier as a standard flat card with standardized contact field.

The sixth additional contact will be used to switch secure elements in such a way so than powering can be brought to it, e.g. by short circuit with the first additional contact, which would be evaluated by the inner circuits of the removable memory card as an instruction to switch the first secure element into active mode and to disconnect the second secure element. The termination of the sixth additional contact powering will cause the opposite situation.

The data processing of the removable memory card will take place mostly in three phases. In the first phase, basic software equipment and data needed for the run of hardware elements (mainly for the communication with the secure element) are loaded. Basically, this phase means making the raw hardware, which beforehand had only the basic equipment from the supplier of independent elements, alive. The second phase, the pre-personalization phase is linked with the loading of data and specific software for the run of payment terminal, including encryption keys. After this phase, the removable memory card is prepared for the personalization for the benefit of a specific person. The first two phases run in the personalization device, even though they are basically only a pre-preparation. In the third phase the data related to the future holder of the removable memory card such as the user of a payment device are loaded to the removable memory card. This phase corresponds to the common tasks of the device for the payment card personalization. These phases can be carried out during one or more insertions of the removable memory card into the device.

Depending on the logistics selected, it is possible to have in advance only "rough" removable memory cards or "half-rough" removable memory cards prepared which went through the first, resp. through the first and the second phase of processing during the manipulation and then they wait for the personalization with data of the card issuer who signed the particular contract with the user. Then for the personalization itself the functional and tested removable memory cards are used. In a different logistics setting, all three phases can be carried out gradually during one run in the burning device. The producer provides access data and rights to the second secure element to the payment card issuer who will change the original access data during the upload of the payment card into the secure element and who will thus have the exclusive access to sensitive personalization data. Since it is not necessary to use the sixth additional contact for the access to the second element, a standard device can be used for the last phase of the personalization.

After the third phase is completed, we can send a request for the termination of the connection between additional contacts and internal circuits to the removable memory card. The gate array doing the disconnection can be also programmed in such a way, so, that in case of the first connection of the removable memory card contact interface, i.e. at the moment when the removable memory card is inserted into the slot of the reader, the gate array is permanently set for the disconnection of additional contacts from internal circuits.

After the additional contacts are created, they can be covered with a foil with contacts on the outer side and with touch pads on the inner side of the foil in a way that touch pads are adjacent to additional contacts and the contacts on the outer side of the foil are bigger than the additional contacts. They can be of a full size in accordance with the standard for a payment card contact field. The foil can be used repeatedly. Even in case of a one time use, the foil will be removed from the temporary carrier before the distribution.

FIGURES OVERVIEW

The invention is described in more detail on FIGS. 1 to 24. The figures are not displayed in binding or proportional measures and the size ratio of the removable memory card and the flat card along with the size ration of other elements to each other is not binding but chosen with the goal to increase the clarity of the figures.

On the FIG. 1, there is a common plastic card with a standardized contact field.

Figure 2:
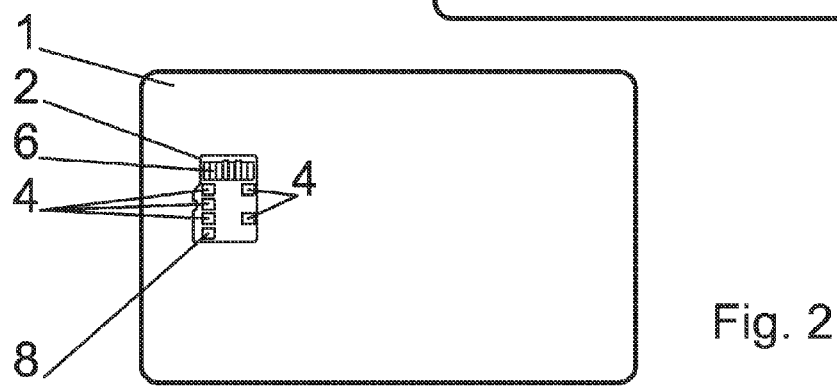

On the FIG. 2, there is a temporary carrier with a removable memory card with six additional contacts displaying the upper surface of the temporary carrier.

Figure 3:
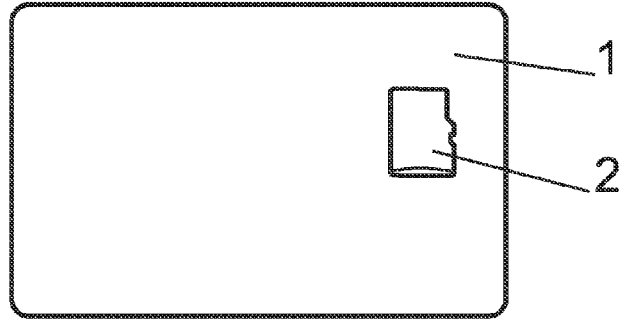

On the FIG. 3, the temporary carrier from the FIG. 2 is shown from the bottom side.

Figures 4, 5:
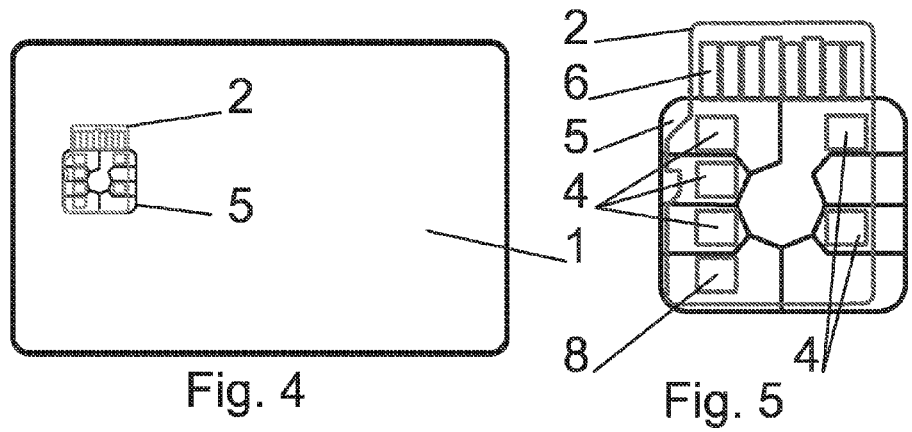

The FIG. 4 shows the interleaving of the flat card standardized contact field and the outline of the removable memory card. On the FIG. 5, there is a detail of the interleaving lines, in which the layout of additional contacts is compliant with the original division of standardized contact field shown in a full line. The removable memory card is outlined by a dashed line.

Figure 6:
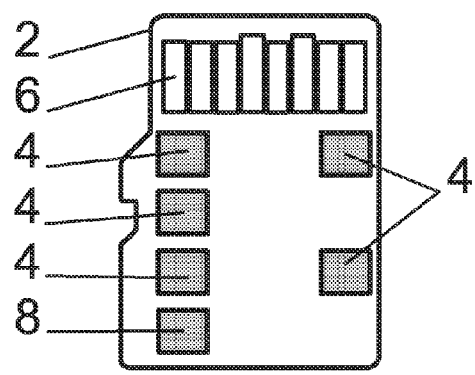
Figure 7:
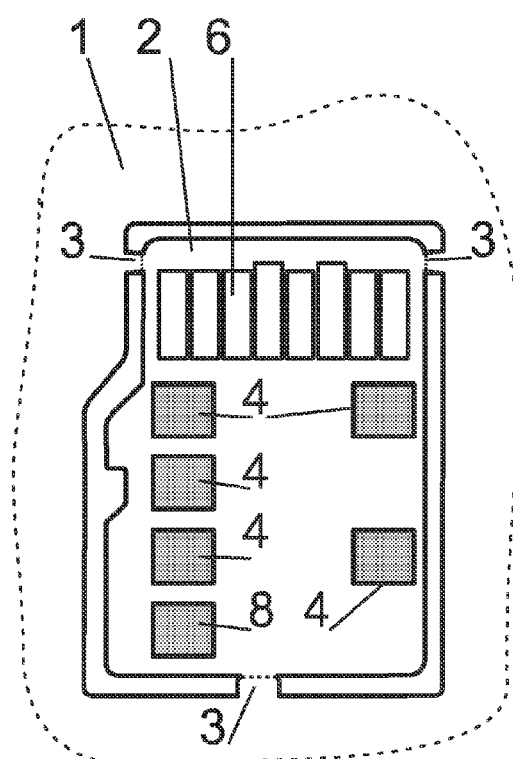

On the FIG. 6, there is removable memory card with five additional contacts after it has been taken out from the temporary carrier. The layout corresponds to the orientation in accordance with FIGS. 2 and 3. On the FIG. 7, there is the same removable memory card in detail with a marked release line.

Figure 8:
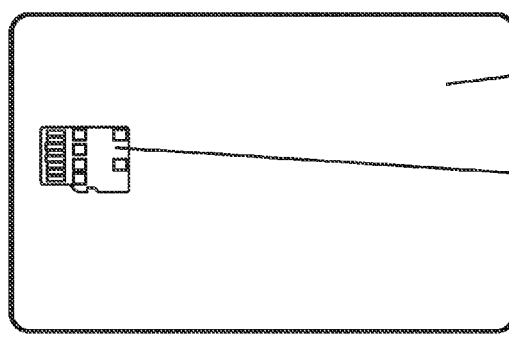
Figure 9:
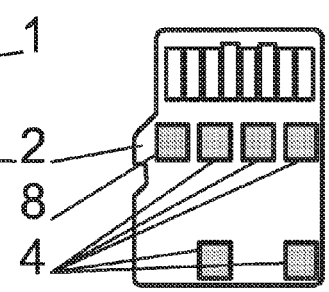

On the FIG. 8, there is a different orientation of the removable memory card with six additional contacts. On the FIG. 9, there is the removable memory card released from the temporary carrier shown in the FIG. 8.

Figure 10:
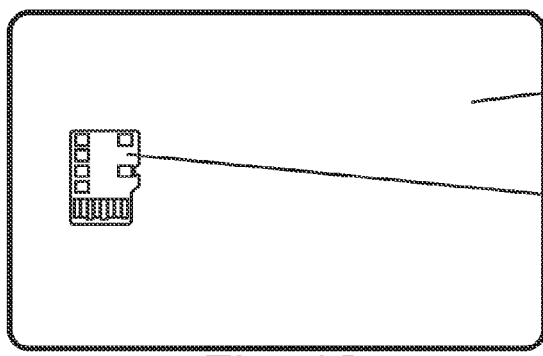
Figure 11:
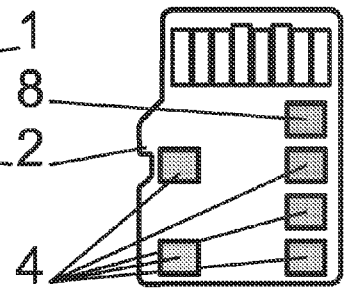

On the FIG. 10 there is a shifted orientation of the removable memory card with six additional contacts, which are on the same surface as the permanent contact interface. On the FIG. 11, there is the removable memory card released from the temporary carrier shown in the FIG. 10.

Figure 12:
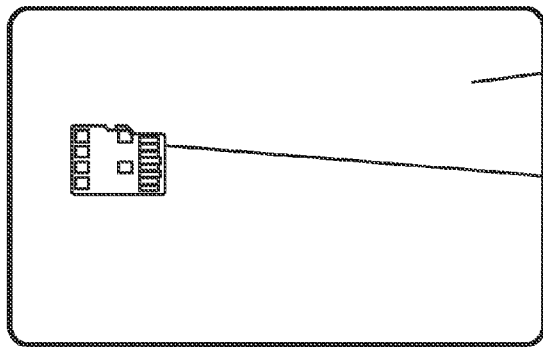
Figure 13:
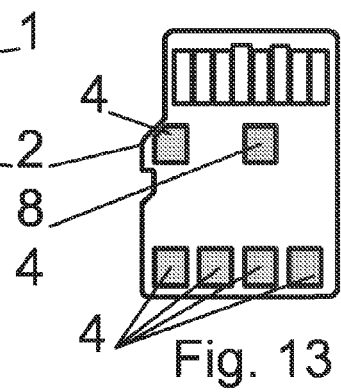

On the FIG. 12, there is another possible orientation of the removable memory card with six additional contacts, which are on the same surface as the standard contact interface. In the mentioned example, the sixth additional switch contact is not in the axis that holds the three additional contacts. In the FIG. 13, there is the removable memory card released from the temporary carrier shown in the FIG. 12.

Figure 14:
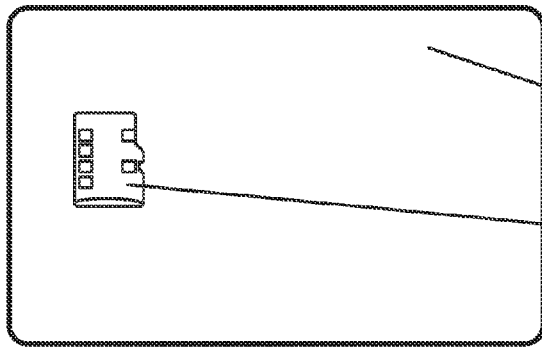
Figure 15:
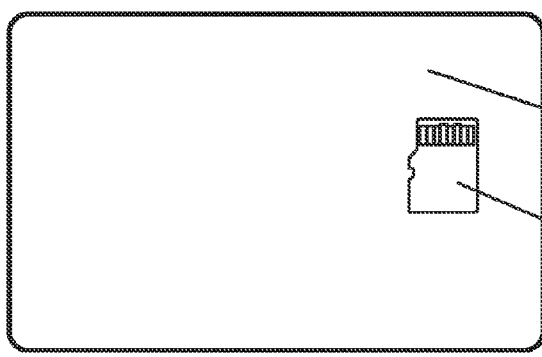
Figures 16, 17:
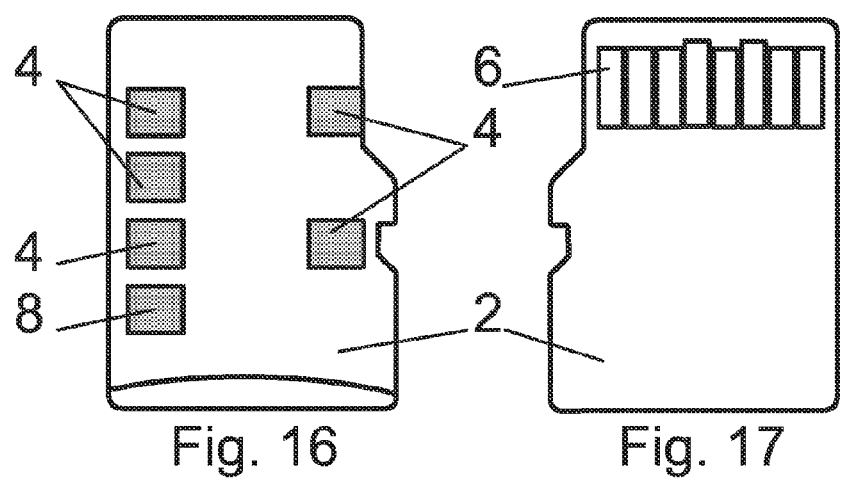

On the FIG. 14, there is a removable memory card with six additional contacts on the opposite side than the standard contact interface. On the FIG. 15, the back bottom side of the temporary carrier is displayed. In the FIGS. 16 and 17, there is the removable memory card released from the temporary carrier from the FIGS. 14 and 15.

Figure 18:
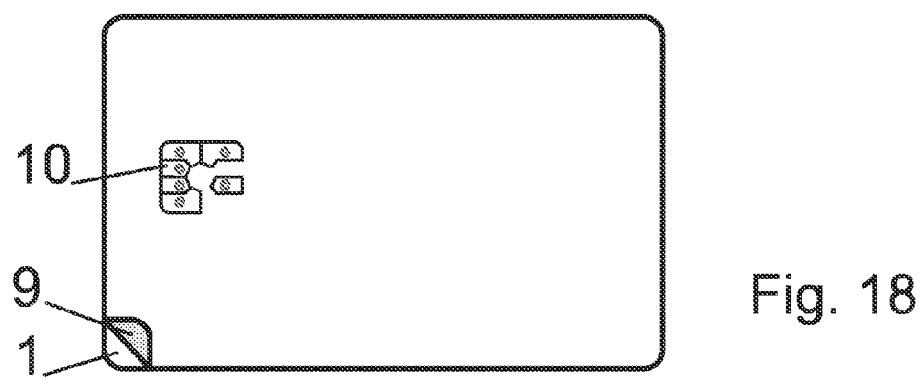

FIG. 18 shows a possibility of extending the size of additional contacts using the foil with big contacts on one side and with small touch pads on the other side of the foil. On the bottom left edge of the temporary carrier the foil is partially pulled off.

Figure 19:
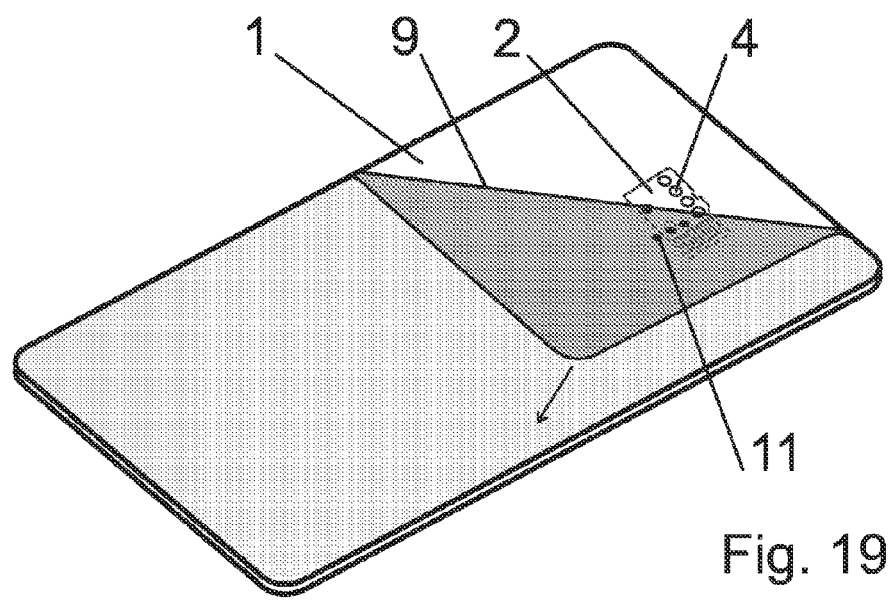

On the FIG. 19, the foil is pulled off in such a way that the contact surfaces have just been drawn off from the contact with additional contacts.

Figure 20:
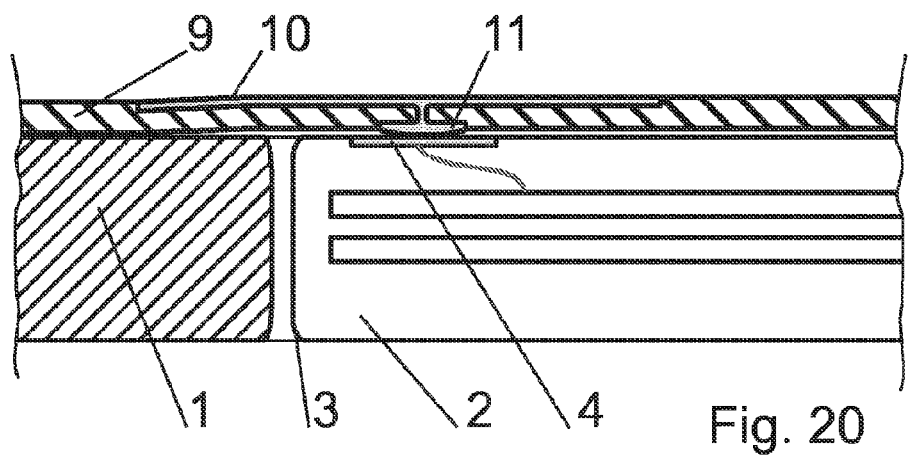

On the FIG. 20 there is a detailed cross-section of the removable memory card next to the release line, where on the surface of the temporary carrier there is a foil with big contacts. The foil and also the big contacts overleap to the body of the flat card.

Figure 21:
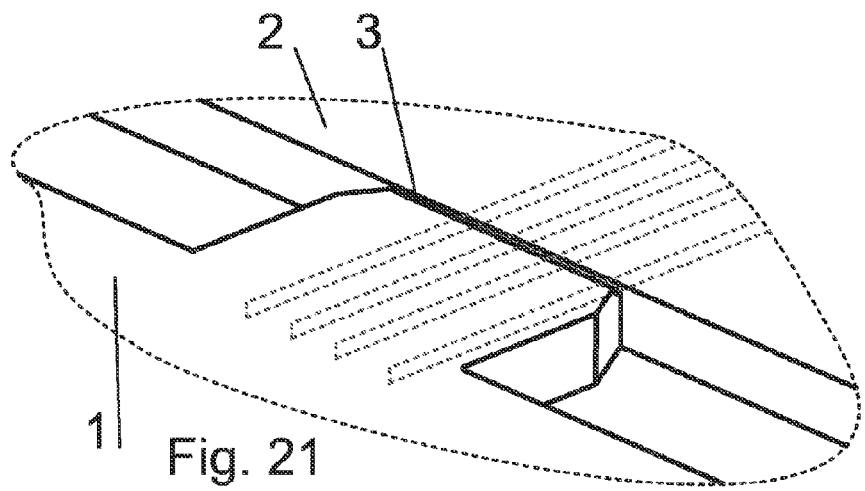
Figure 22:
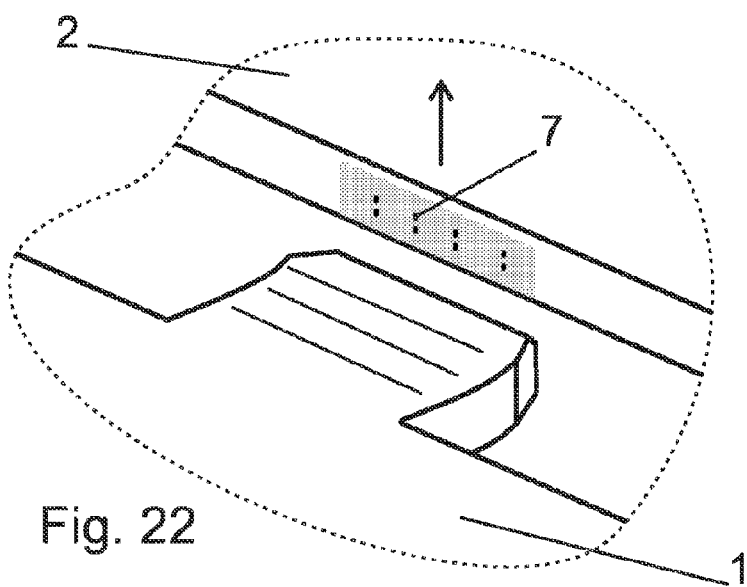

FIGS. 21 and 22 show the possibility to create a mechanical disconnector in the release line; that is, in the body of the connection strip. On the FIG. 21, there is a disconnector in the uninterrupted state, on the FIG. 22 there are disconnected conductors after the removable memory card is released from the temporary carrier. For clarity reason the figure shows only four pairs of conductors, in case of five additional contacts five pairs of conductors are assumed.

The scheme on the FIG. 23 shows some of the various possibilities of mutual distribution of additional contacts in case of one secure element and the FIG. 24 displays the distribution for two secure elements. The first row corresponds to the distribution, which is closest to ISO 7816. In case of two secure elements, the removable memory card behaves from the outside perspective as a one-secure-element-card, if only the additional contacts that are in accordance with the respective scheme in the FIG. 23, are used during card's processing and bonding.

EXAMPLES

Example 1

In this example in accordance to FIGS. 2 to 7 the temporary carrier of the removable memory card 2 is created as a plastic flat card 1 of a standard ID—1 size in compliance with the ISO/IEC 7810, 85.60 mm×53.98 mm.

In the zone, in which there should be an eight-contact field in accordance with the ISO 7816 standard, a removable memory card 2 of microSD format is placed. It is oriented in such a way that the contact interface 6 of the microSD card is in the upper side of the temporary carrier. The edge of the removable memory card 2 is placed in the distance of approximately 8.94 mm from the left edge of the flat card 1 in the part in which the removable memory card 2 is of 11 mm width. In the upper part where the width of the removable memory card 2 is smaller, the distance from the edge of the flat card 1 is approximately 10.24 mm. The upper edge of the removable memory card 2 is at a distance of approximately 14.56 mm from the upper edge of the flat card 1. In case of this layout there are five additional contacts 4 C1, C2, C3, C5, C7 for temporary use before the release from the temporary carrier takes place.

Three of five temporary contacts 4 are in a vertical row one below the other. The fourth and fifth additional contacts 4 are in the second row, in the second line of additional contacts 4. The left edge of three additional contacts 4 is in a distance of approximately 10.52 mm from the left edge of the flat card 1. The fourth and fifth additional contact 4 is at a distance of approximately 17.60 mm from the left edge of the flat card 1 and the bottom edge of the additional contact 4 in the right row, just like the bottom edge of the third addition contact 4 is at a distance of approximately 26.01 mm from the upper edge of the flat card 1. The sixth additional switch contact 8 is placed in the left line under the three additional contacts 4.

All additional contacts 4, 8 are of approximately square shape and the length of their side does not exceed 2.5 mm.

In this example the additional contacts 4, 8 are placed at the same side as the contact interface 6 of the removable memory card 2 is situated, above all due to technological reasons, which limit the process in which layers and substrates of the removable memory card 2 are applied. However, in principle the additional contacts 4, 8 can be created also on the other side of the removable memory card 2.

The removable memory card 2 is oriented in such a way that the three additional contacts 4 C1 to C3 are in the line vertical to the layout of contacts of the microSD card interface 6. The removable memory card 2 has internal circuits with two secure elements and is intended for the creation of a payment device and a POS terminal in the mobile communication device. The purpose of the temporary carrier is to load data and software gradually to the removable memory card 2 for the POS payment terminal which will be included on the removable memory card 2 along with data and software for the payment card.

On the flat card 1, the removable memory card 2 forms a limited element intended for the release from the body of the flat card 1. The release line 3 is formed by a thin space between the edge of the removable memory card 2 and by an adjacent, shaped opening in the flat card 1. The removable memory card 2 is connected with the body of the flat card 1 by a foil applied to the bottom side. In case the removable memory card 2 is attached to the temporary carrier using the foil we can produce the removable memory card 2 itself independently from the temporary carrier, i.e. separately as by now, it does not have to be produced along with the break-out lines as in case the card was embedded in the body of the big flat card directly in the production.

The gaps between the contacts 4 including the sixth additional switch contact 8 correspond to the gaps of relevant standardized contacts of the field 5 of the flat card 1. The common layout of the payment chip card standardized contacts is displayed in the FIG. 1. The position of the additional contacts 4, 8 within the external parameters of the temporary carrier corresponds to the layout of the standardized contact field 5 of the flat card 1. The additional contacts 4, 8 are interconnected with internal circuits of the removable memory card 2 independently from the contact interface 6.

Four additional contacts 4 are intended for—C1 and C5 for the power supply and data transition to inner circuits, C2 for reset of the internal circuit, C3 for the clocking of the communication running over the additional contacts 4 C7 is used as a serial input output. The sixth additional contact 8 in the position of C4 is intended exclusively to switch one of two secure elements into the active mode. The layout of additional contacts 4, 8 is chosen in such a way so that the NFC antenna placed in the body of the removable memory card 2 is shielded only minimally. The NFC antenna is placed along the bottom edge, by its projection into the common design plane it interleaves only partially with the additional contact 8 C4.

The removable memory card 2 as part of the temporary carrier, is, in this example, also equipped with a disconnector 7 in the form of a programmable FPGA gate array. The disonnector 7 is connected between additional contacts 4, 8 and internal circuits of the removable memory card 2 for disconnection of additional contacts 4, 8 from internal circuits before the removable memory card 2 is released from the flat card 1.

The removable memory card 2 can be produced along with the surrounding body as part of the temporary carrier, in other case it can be produced separately and then inserted into the body of the flat card 1. In case the removable memory card 2 is directly produced as part of the temporary carrier, it will be possible to load the firmware and data in the pre-personalization phase also over the additional contacts 4, 8. Additional contacts 4, 8, will be created on the surface of the removable memory card 2 in a way that their position within the temporary carrier corresponds with the placement of contacts on the standardized flat card 1. The additional contacts 4, 8 will be interconnected with the internal circuits of the removable memory card 2 directly during the placement of layers in the production of the card 2.

In this example, the firmware for the basic run of the components is loaded into the removable memory card 2 during the production of the microSD cards. The firmware includes operating systems and interface and memory programs. The operating systems and encryption devices are loaded to both secure elements by the supplier of the respective chips. After the basic processing, in this example, the removable memory card 2 is inserted into the slot of the body of the temporary carrier where it is held in place by a sticking or adhesive foil. Subsequently, the temporary carrier created in this way is inserted into the storage device for data and/or software, whereas the device works with the temporary carrier in the same way as in case of the standard flat card 1 with standardized contact field 5. Data for the run of payment applications are loaded and stored into the removable memory card 2 over the additional contacts 4, 8. Using the sixth additional switch contact 8 the device will switch the individual secure elements ICC1 and ICC2 into the exclusive active mode depending on the fact to which secure element belong the POS terminal data and applications and to which the payment card data and applications.

The subsequent processing can be carried out in a way that e.g. the temporary carrier is inserted into the device in which we are able to control also the needle for the contact C4, respectively for the sixth additional switch contact 8, the position of which corresponds to C4. The control can be simple, e.g. by bringing the voltage, resp. by interconnection with the contact C1. The internal circuits of the removable memory card 2 react in such a way that they enable the access to the secure element, which corresponds to the POS application. If there is no voltage, i.e. the temporary sixth additional switch contact 8 is not used in C4 position, will cause the removable memory card 2 to behave like a device with one secure element which is meant for payment card applications.

In the pre-personalization phase payment terminal data and software along with encryption keys are transmitted to inner circuits. In the last, third phase personalization data related to a future holder of the removable memory card 2 are stored to the payment device in accordance with particular instructions from the bank, respectively the issuer of the payment card.

In this example the first two pre-personalization phases are carried out separately, the first phase is carried out over the contact interface 6 of the removable memory card 2 and the other phase over five additional contacts 4 using also the switching function of the sixth additional switch contact 8. By this, an inventory of pre-prepared, functional cards is to be created. Then, in the last phase, once data of the payment device particular user are acquired, the personalization itself is carried out in the device. This third phase can also be done on a device different from the device on which the second phase was carried out, since now it is not necessary to control the sixth additional switch contact 8, the access to the second secure element intended for the payment card issuer, is sufficient.

In the last step of data processing in the device the request for the termination of the connection between the additional contacts 4 and inner circuits is sent to the removable memory card 2. Then a secure foil with protective elements, signalizing its removal, is applied on the upper surface of the temporary carrier. The secure foil overlaps the contact interface 6 as well as additional contacts 4, 8.

In the removable memory card 2 there is also a software application which in case of need also sends the request for the disconnection in the disconnector 7 when the memory card 2 is inserted into the slot of the communication device for the first time.

The hierarchy of access rights can be set in such a way that at the beginning the producer of pre-prepared removable memory cards 2 has the access to both secure elements, whereas he stores applications for the POS terminal on the first secure element. The issuer is then provided access data to the second element only. When loading the payment card to the second secure element the issuer changes the original access data and has the exclusive access to his sensitive personalization data. The producer of the pre-prepared removable memory card 2 has the access to the first secure element only.

Example 2

This example shown in FIGS. 18 to 22 differs from the first one namely by using of the foil 9 with contacts 10 within the flat card 1.

On the outside surface of the carrier, in the location of the removable memory card 2, there is a thin foil 9 attached from the upper side; it has six contacts 10 on the external side of the foil 9. Contacts 10 correspond by their position and shape to the relevant contacts of the standardized contact field 5 of the flat payment card 1. The foil 9 exceeds the release line 3. The flexible contacts 10 on the foil 9 are interconnected with the touch pads 11 on the internal side of the foil 9 through openings. The contact surfaces 11 are adjacently attached to the additional contacts 4, 8 on the removable memory card 2. The foil 9 is removable from the body of the removable memory card 2, by removing the foil the connection of contact surfaces 11 with additional contacts 4, 8 is interrupted. The contact surfaces 11 overreach the internal side of the foil 9, by which the necessary down pressure of contacts is created. The foil 9 with contacts 10 can also be used repeatedly.

The disconnector 7 in this example is in the shape of conductors connecting the temporary carrier with the body of the removable memory card 2 over the brake-out line. They protrude from the body of the removable memory card 2. At the same time the conductors get back to the body of the removable memory card 2 over this brake-out line. Once the removable memory card 2 is taken out of the temporary carrier the conductors are disconnected and the connection between the additional contacts 4, 8 and internal circuits is terminated.

Since in this example the removable memory card 2 is produced as part of the temporary carrier, the first pre-personalization phase of processing will already be carried out over the additional contacts 4, 8.

INDUSTRIAL USABILITY

The industrial usability is obvious. According to this solution it is possible to produce and use industrially the temporary carriers of memory cards in the form and with sizes of standard flat cards. According to this solution it is possible to communicate over additional contacts in positions based on existing standard for plastic payment cards.

LIST OF RELATED SYMBOLS

1—Flat card
2—Removable memory card
3—Release line
4—Additional contact
5—Contact field of the flat card
6—Contact interface of the removable memory card
7—Disconnector
8—Sixth additional switch contact
9—Foil
10—Contacts on the foil
EMV—Europay MasterCard VISA

The invention claimed is:

1. A temporary carrier comprising:
a flat card body; and
a removable memory card that has inner circuits and a microSD contact interface with a different contact layout than a contact field of a flat payment card, said removable memory card adapted to store uploaded payment application data and/or software, wherein:
said flat card body includes said removable memory card as a limited element intended for release from the flat card body by breaking off the removable memory card from the flat card body along a release line;
the removable memory card is equipped with at least five additional contacts on its surface outside the microSD contact interface, these additional contacts enabling a temporary use before the removable memory card is released from the flat card body, wherein the at least five additional contacts correspond by their positions to contacts C1, C2, C3, C5, and C7 according to ISO 7816, and wherein additional contacts corresponding to the contacts C1 and C5 are interconnected with the inner circuits of the removable memory card to supply the inner circuits with power, where C1 represents power supply, C5 represents grounding, and the additional contact corresponding to the contact C2 provides a reset of the inner circuit, the additional contact corresponding to the contact C3 provides for clocking of communication that runs over the additional contacts, and the additional contact corresponding to the contact C7 provides data input and output;
a sum of surfaces of additional contacts on the removable memory card is smaller than the contact field of the flat payment card whereby every individual additional contact takes up a smaller surface than a corresponding contact in the contact field of the flat payment card;
gaps between the additional contacts substantially correspond to the gaps between contacts in the contact field of the flat payment card;
the removable memory card is oriented and placed within the flat card body in such a way that a position of additional contacts within outer parameters of the temporary carrier corresponds to the position of the contact field of the flat payment card where the contact field of the flat payment card overlays predetermined contact positions for the flat card body, and;
additional contacts are interconnected with the inner circuits of the removable memory card independently from the microSD contact interface where the additional contacts and the microSD contact interface are placed on the removable memory card;
the removable memory card has at least two secure elements and a sixth additional contact that is interconnected with the inner circuits for exclusive switching of one secure element into an active mode, and wherein the sixth additional contact is located in the axis of three additional contacts and, by its position, corresponds to a C4 contact according to ISO 7816;
wherein the removable memory card has a disconnector connected between the additional contacts and the inner circuits of the removable memory card in order to disconnect the additional contacts from the inner circuits before the removable memory card is released from the flat card body, and the disconnector is in the form of conductors comprising gate array that go out of the removable memory card to other parts of the flat card body through a break-off line and then the conductors return through the break-off line back to the removable memory card, and the disconnector conductors run through the break-off lines that connect the temporary carrier with the removable memory card; and
the temporary carrier further comprises a security foil at least on one side, wherein the security foil has protection elements signaling its removal from the temporary carrier and covers the microSD contact interface and/or additional contacts.

2. A temporary carrier of a removable memory card according to claim 1, wherein from the at least five additional contacts there is one additional contact provided for power supply, one additional contact provided for data transmission to the inner circuits, one additional contact provided for grounding, one additional contact provided for reset of the inner circuit, and one additional contact provided for clocking of communication that runs through the additional contacts.

3. A temporary carrier of a removable memory card according to claim 1, wherein the removable memory card has a NFC communication element with an antenna while at least parts of the additional contacts are located outside an antenna projection to an outer part of the removable memory card.

4. A temporary carrier of a removable memory card according to claim 1, wherein the disconnector is in the form of a programmable gate array.

5. A temporary carrier of a removable memory card according to claim 1, further comprising a foil that holds the removable memory card in the flat card body.

6. A temporary carrier comprising:
a flat card body; and
a removable memory card that has inner circuits and a contact interface with a different contact layout than a contact field of a flat payment card, said removable memory card adapted to store uploaded payment application data and/or software, wherein:
said flat card body includes said removable memory card as a limited element intended for release from the flat card body by breaking off the removable memory card from the flat card body along a release line, the removable memory card is equipped with at least five additional contacts on its surface outside the contact interface, these additional contacts enabling a temporary use before the removable memory card is released from the flat card body, a sum of surfaces of additional contacts on the removable memory card is smaller than the contact field of the flat payment card, gaps between the additional contacts substantially correspond to the gaps between contacts in the contact field of the flat payment card, the removable memory card is oriented and placed within the flat card body in such a way that a position of additional contacts within outer parameters of the temporary carrier corresponds to the position of the contact field of the flat payment card where the contact field of the flat payment card overlays predetermined contact positions for the flat card body, and additional contacts are interconnected with the inner circuits of the removable memory card independently from the contact interface where the additional contacts and the contact interface are placed on the removable memory card, wherein on an outer surface of the temporary carrier in the location of the removable memory card there is a foil with at least five contacts on an outer side of the foil, wherein contacts correspond by their location and shape to corresponding contacts of the contact field of the flat payment card, wherein the foil overlaps the break-off line, and wherein contacts on the foil are on the inner side of the foil interconnected with the additional contacts on the removable memory card and the foil can be removed from the removable memory card body.

7. A temporary carrier of a removable memory card according to claim 6, wherein the contacts on the outer side of the foil are interconnected with touch pads on the inner side of the foil, and the touch pads are closely pressed to the additional contacts on the removable memory card.

8. A temporary carrier of a removable memory card according to claim 7, wherein the touch pads overlap from the inner side of the foil.

9. A temporary carrier of a removable memory card according to claim 1, wherein the flat card body is adapted such that the removable memory card is released by means of contact needles designed for the contact field of the flat payment card.

* * * * *